United States Patent
Kim et al.

(10) Patent No.: US 12,463,126 B2
(45) Date of Patent: Nov. 4, 2025

(54) SEMICONDUCTOR PACKAGE

(71) Applicant: Samsung Electronics Co., Ltd., Suwon-si (KR)

(72) Inventors: Jungjoo Kim, Suwon-si (KR); Yongkwan Lee, Suwon-si (KR); Seung Hwan Kim, Suwon-si (KR); Jongwan Kim, Suwon-si (KR); Junwoo Park, Suwon-si (KR); Taejun Jeon, Suwon-si (KR); Junhyeung Jo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 377 days.

(21) Appl. No.: 18/060,812

(22) Filed: Dec. 1, 2022

(65) Prior Publication Data

US 2023/0395482 A1 Dec. 7, 2023

(30) Foreign Application Priority Data

Jun. 2, 2022 (KR) .................. 10-2022-0067679

(51) Int. Cl.
*H01L 23/498* (2006.01)
*H01G 4/228* (2006.01)
(Continued)

(52) U.S. Cl.
CPC ....... *H01L 23/49838* (2013.01); *H01G 4/228* (2013.01); *H01L 23/5383* (2013.01); *H01L 23/5385* (2013.01); *H01L 23/5389* (2013.01); *H01L 25/16* (2013.01); *H01L 25/162* (2013.01); *H01G 4/08* (2013.01); *H01G 4/224* (2013.01);
(Continued)

(58) Field of Classification Search
CPC .......... H01L 23/49838; H01L 23/5383; H01L 23/5385; H01L 23/5389; H01L 25/16; H01L 25/162; H01L 24/16; H01L 24/32; H01L 24/73; H01L 2224/16227; H01L 2224/32225; H01L 2224/73204;
(Continued)

(56) References Cited

U.S. PATENT DOCUMENTS 8,338,945 B2  12/2012  Yu et al.
9,502,341 B2  11/2016  Song et al.
(Continued)

FOREIGN PATENT DOCUMENTS

KR  101067207 B1  9/2011

*Primary Examiner* — Fernando L Toledo
*Assistant Examiner* — Neil R Prasad
(74) *Attorney, Agent, or Firm* — Harness, Dickey & Pierce, P.L.C.

(57) ABSTRACT

A semiconductor package including a dielectric layer on a substrate and having an opening that partially exposes a top surface of the substrate, a capacitor chip on the substrate and in the opening of the dielectric layer, connection terminals between the substrate and the capacitor chip and connecting the substrate and the capacitor chip to each other, dielectric patches on the substrate and in the opening of the dielectric layer, and an under-fill filling a space between the substrate and the capacitor chip may be provided. The space between the substrate and the capacitor chip includes a first region, a second region, and a third region between the first and second regions. The connection terminals are on the first region and the second region. The dielectric patches are on the third region.

20 Claims, 10 Drawing Sheets

(51) Int. Cl.
  *H01L 23/538*  (2006.01)
  *H01L 25/16*  (2023.01)
  *H01G 4/08*  (2006.01)
  *H01G 4/224*  (2006.01)
  *H01L 23/00*  (2006.01)

(52) U.S. Cl.
  CPC .............. *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H01L 2924/19041* (2013.01); *H01L 2924/19106* (2013.01)

(58) Field of Classification Search
  CPC .......... H01L 2924/19041; H01L 2924/19106; H01G 4/228; H01G 4/08; H01G 4/224
  See application file for complete search history.

(56) References Cited

U.S. PATENT DOCUMENTS

| | | |
|---|---|---|
| 10,475,749 B2 | 11/2019 | Kim |
| 10,957,629 B2 | 3/2021 | Kim |
| 2010/0264549 A1 | 10/2010 | Ko et al. |
| 2011/0110058 A1 | 5/2011 | Kim et al. |
| 2014/0027920 A1* | 1/2014 | Kodama ................ H01L 23/28 257/773 |
| 2015/0130041 A1* | 5/2015 | Seo ..................... H01L 23/3128 438/109 |
| 2017/0005453 A1* | 1/2017 | Yim ......................... H10F 77/40 |
| 2019/0013301 A1* | 1/2019 | Cheah ................ H01L 21/6836 |
| 2019/0103364 A1* | 4/2019 | Kim .................. H01L 23/49816 |
| 2019/0157222 A1* | 5/2019 | Lakhera ................ H01L 21/78 |
| 2021/0134761 A1 | 5/2021 | Oh et al. |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0067679 filed on Jun. 2, 2022 in the Korean Intellectual Property Office, the disclosure of which is hereby incorporated by reference in its entirety.

BACKGROUND

The present inventive concepts relate to semiconductor packages, and more particularly, to semiconductor packages including a capacitor chip mounted on a substrate.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board.

A flip-chip bonding method is a way in which solder bumps are arranged on a floor of a chip and then directly bonded to a substrate, and has many advantages because of relatively small package size and high package density, as compared to other connection techniques. However, flip-chip bonding parts are vulnerable to impact and experience distortion due to a difference in thermal expansion coefficient between the chip and the substrate. Thus, an under-fill material may be required on the floor of the chip so as to protect the solder bumps and to compensate for the thermal expansion coefficients of the chip and the substrate. Research on the under-fill process may increase in structural stability of the semiconductor package.

SUMMARY

Some example embodiments of the present inventive concepts provide semiconductor packages with improved structural stability.

Example embodiments of the present inventive concepts are not limited to the mentioned above, and some other example embodiments which have not been mentioned above will be clearly understood to those skilled in the art from the following description.

According to some example embodiments of the present inventive concepts, a semiconductor package includes a substrate, a dielectric layer on the substrate, the dielectric layer having an opening that exposes a portion of a top surface of the substrate, a capacitor chip mounted on the substrate and being in the opening of the dielectric layer, connection terminals between the substrate and the capacitor chip, the connection terminals connecting the substrate and the capacitor chip to each other, dielectric patches on the substrate and in the opening of the dielectric layer, and an under-fill filling a space between the substrate and the capacitor chip. The space between the substrate and the capacitor chip may include a first region, a second region, and a third region between the first region and the second region. The first and second regions are horizontally spaced apart from each other. The connection terminals are on the first region and the second region. The dielectric patches are on the third region. A top surface of the dielectric layer is at a same level as top surfaces of the dielectric patches.

According to some example embodiments of the present inventive concepts, a semiconductor package includes a first substrate, a dielectric layer below the first substrate, the dielectric layer exposing a portion of the first substrate, a capacitor chip mounted on the portion of the first substrate, the portion being exposed by the dielectric layer, an under-fill filling a space between the first substrate and the capacitor chip, connection terminals between the first substrate and the capacitor chip and electrically connecting the first substrate to the capacitor chip, the connection terminals including first connection terminals and second connection terminals spaced apart from the first connection terminals, dielectric patches below the first substrate and between the first connection terminals and the second connection terminals, the dielectric patches including a same material as the dielectric layer, a first semiconductor chip mounted on the first substrate, and a first molding layer on the first substrate, the first molding layer covering the first semiconductor chip.

According to some example embodiments of the present inventive concepts, a semiconductor package includes a substrate, a dielectric layer exposing a mount region of the substrate, a capacitor chip mounted on the mount region of the substrate, connection terminals between the substrate and the capacitor chip and connecting the substrate and the capacitor chip, dielectric patches on the substrate and on the mount region of the substrate, the mount region being exposed by the dielectric layer, and an under-fill filling a space between the substrate and the capacitor chip. The mount region includes a first region, a second region, and a third region between the first region and the second region. The first and second regions are provided with the connection terminals. The third region is provided with the dielectric patches. A first distance between an adjacent pair of the connection terminals, a second distance between an adjacent pair of the dielectric patches, and a third distance between each of the connection terminals and a corresponding one of the dielectric patches are a same distance.

DETAIL DESCRIPTION

The following will now describe semiconductor packages according to some example embodiments of the present inventive concepts with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
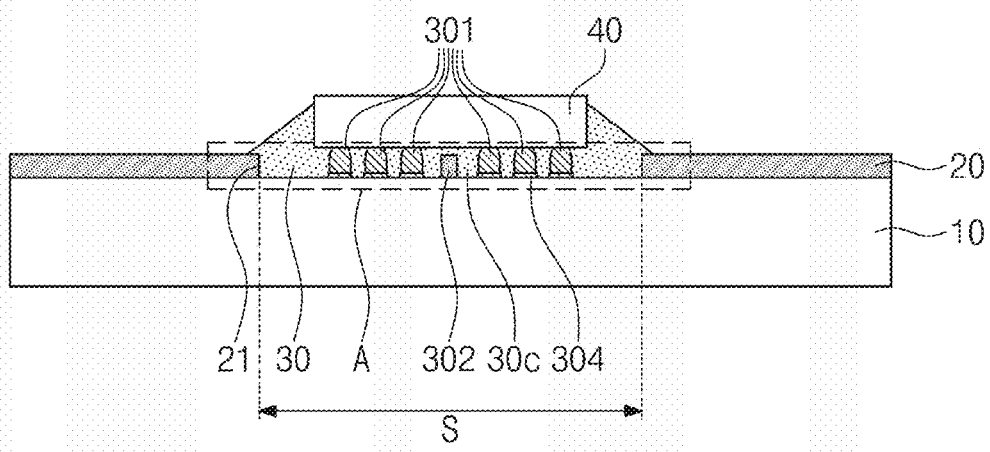
FIG. 1 illustrates a cross-sectional view showing a semiconductor package according to an example embodiment of the present inventive concepts.
Figure 2:
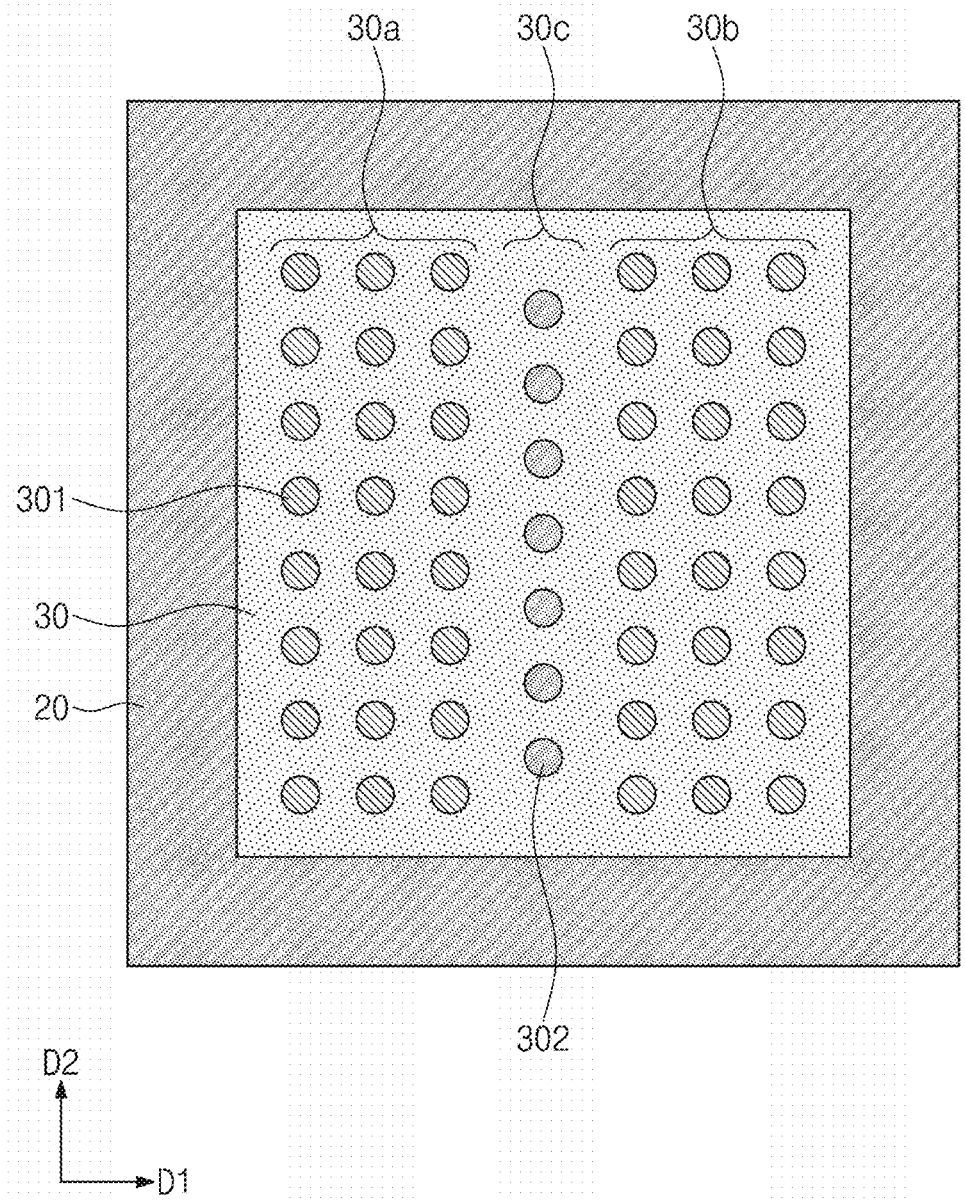
FIGS. 2 to 6 illustrate enlarged plan views showing section A of FIG. 1.

FIG. 1 illustrates a cross-sectional view showing a semiconductor package according to an example embodiment of the present inventive concepts. FIG. 2 illustrates an enlarged view showing section A of FIG. 1.

Referring to FIGS. 1 and 2, a substrate 10 may be provided. The substrate may include a printed circuit board (PCB). For example, the substrate 10 may have a structure in which a substrate base and a wiring layer are stacked. The substrate 10 may have a top surface and a bottom surface that are opposite to each other. The substrate 10 may be provided with connection pads 304 on the top surface thereof. The connection pads 304 may allow the substrate 10 to have a capacitor chip 40 mounted thereon as discussed below. The connection pads 304 may include a conductor. The connection pads 304 may be connected to wiring lines formed in the substrate 10.

A dielectric layer 20 may be positioned on the substrate 10. The dielectric layer 20 may include a solder resist. The dielectric layer 20 may be positioned on an edge of the substrate 10. The dielectric layer 20 may have an opening 21 that vertically penetrates the dielectric layer 20. The opening 21 may expose a portion of the top surface of the substrate 10. The portion of the top surface of the substrate 10 that is exposed by the dielectric layer 20 may correspond to a mount region S on which a capacitor chip 40 is mounted. The mount region S may have a first region 30a and a second region 30b that are spaced apart from each other in a first direction D1, and may additionally have a third region 30c between the first region 30a and the second region 30b. The first direction D1 and the second direction D2 may be parallel to the top surface of the substrate 10, and the second direction D2 may be orthogonal to the first direction D1. The dielectric layer 20 may have an inner sidewall perpendicular to the top surface of the substrate 10.

A capacitor chip 40 may be mounted on the substrate 10. The capacitor chip may be mounted on the mount region S exposed by the dielectric layer 20. The capacitor chip 40 may be disposed inside the opening 21 of the dielectric layer 20. The capacitor chip 40 may be flip-chip mounted on the substrate 10. For example, the capacitor chip 40 may be provided with connection terminals 301 on a bottom surface thereof. Although not shown, the connection terminals 301 may be coupled to chip pads of the capacitor chip 40. FIG. 1 depicts that one capacitor chip 40 is mounted on the substrate 10, but the present inventive concepts are not limited thereto. According to some example embodiments, a plurality of capacitor chips 40 may be mounted on the mount region S of the substrate 10. The capacitor chip 40 may include a silicon capacitor.

The connection terminals 301 may be provided between the substrate 10 and the capacitor chip 40. The connection terminals 301 may be provided on the mount region S. The connection terminals 301 may not be in contact with the dielectric layer 20. The connection terminals 301 may correspond to the connection pads 304. The connection terminals 301 may be coupled to the connection pads 304. The connection terminals 301 may be electrically connected through the connection pads 304 to the substrate 10. Therefore, the substrate 10 and the capacitor chip 40 may be electrically connected through the connection terminals 301. The connection terminals 301 may be provided on the first region 30a and the second region 30b that are spaced apart from each other in the first direction D1. The first region 30a and the second region 30b may each include at least one column in which the connection terminals 301 are arranged in the second direction D2. As shown in FIG. 2, the arrangement of the connection terminals 301 on the first region 30a may be symmetric to that of the connection terminals 301 on the second region 30b, and three columns of the connection terminals 301 may be provided on each of the first and second regions 30a and 30b. The arrangement of the connection terminals 301 is not limited to that discussed above, and the arrangement of the connection terminals 301 on the first region 30a may be asymmetric to that of the connection terminals 301 on the second region 30b. The number of the columns constituted by the connection terminals 301 may be two, three, or more, if desired. An interval between the connection terminals 301 arranged on the first region 30a may be different from that between the connection terminals 301 arranged on the second region 30b.

The substrate 10 may be provided with dielectric patches 302 on the top surface thereof. The dielectric patches 302 may be provided on the third region 30c between the first region 30a and the second region 30b. The third region 30c may be an area between the first region 30a and the second region 30b where the connection terminals 301 are not provided. The third region 30c may be an area between the substrate 10 and the capacitor chip 40 where the density of the connection terminals 301 is reduced. For example, the third region 30c may be an area on which the connection terminals 301 are not provided in accordance with wiring aspects of the capacitor chip 40. The third region 30c may constitute at least one column in which the dielectric patches 302 are arranged in the second direction D2. For another example, when two capacitor chips are mounted on the substrate 10, the third region 30c may be an area where the density of the connection terminals 301 is reduced between the capacitor chips. In this description, the density of the connection terminals may refer to the number or total area of the connection terminals. A width in the first direction D1 of the third region 30c may be greater than a diameter of each of the connection terminals 301. The dielectric patches 302 may have their top surfaces located at the same level, from the top surface of the substrate 10, as that of a top surface of the dielectric layer 20. The dielectric patches 302 may be formed of the same material as that of the dielectric layer 20. The dielectric patches 302 may each have a circular planar shape. The present inventive concepts, however, are not limited thereto, and the dielectric patches 302 may each have a tetragonal or polygonal planar shape. When viewed in plan, each of the dielectric patches 302 may have an area of about 0.8 times to about 1.2 times that of each of the connection terminals 301.

An under-fill 30 may be formed on the top surface of the substrate 10. The under-fill 30 may be formed on the bottom surface of the capacitor chip 40. For example, the under-fill 30 may fill an empty space between the substrate 10 and the capacitor chip 40. The under-fill 30 may be in contact with the connection terminals 301 and the dielectric patches 302. The under-fill 30 may include an adhesive material. The under-fill 30 may be a viscous material. The under-fill 30 may include $SiO_2$. The under-fill 30 may have a thermal expansion coefficient different from those of the substrate 10 and the capacitor chip 40. The under-fill 30 may have a thermal expansion coefficient to compensate for a thermal expansion coefficient of the substrate 10 or the capacitor chip Therefore, the under-fill 30 may mitigate or prevent distortion of the substrate 10 and/or the capacitor chip 40 and may increase structural stability of a semiconductor package.

Figure 3:
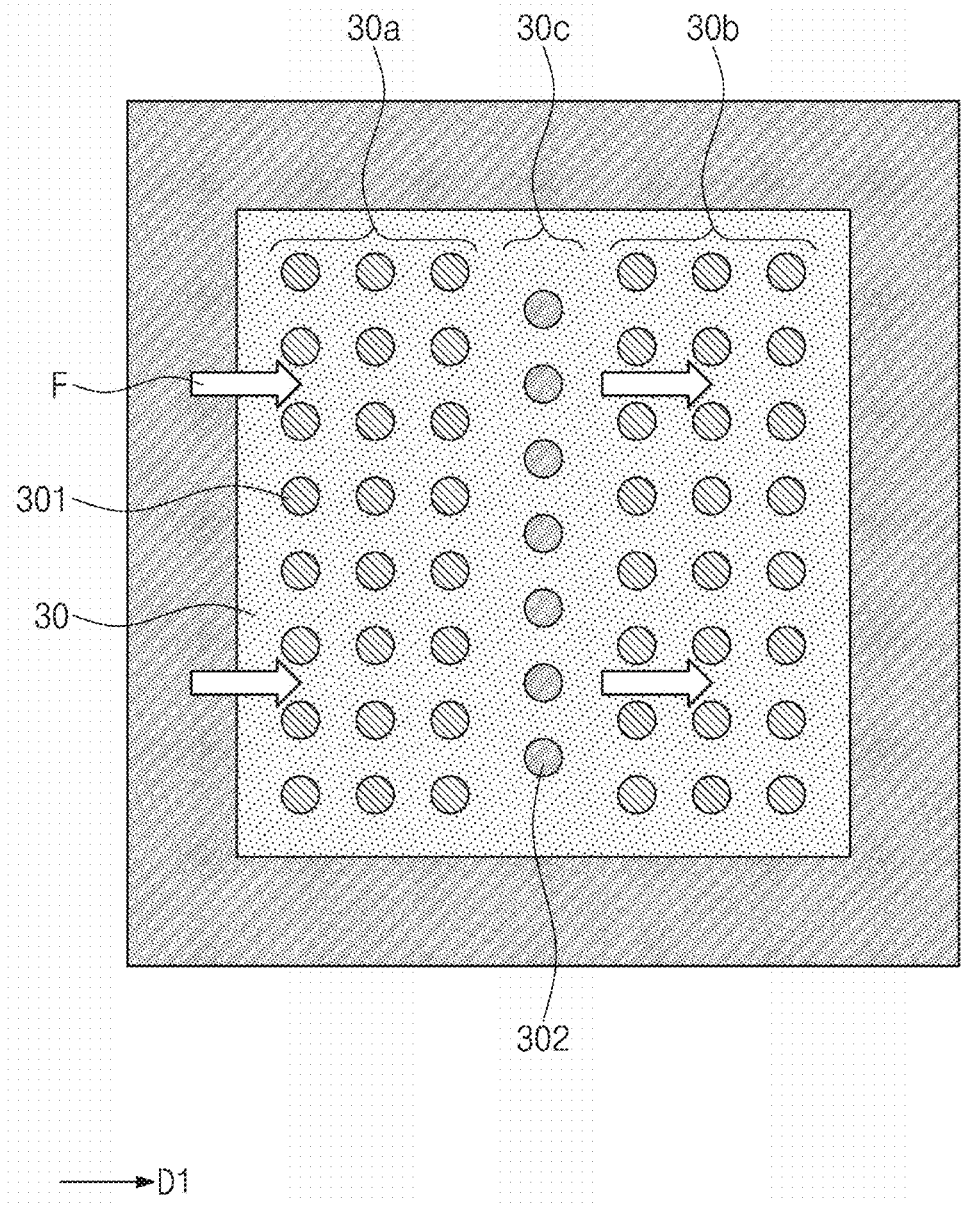

FIG. 3 illustrates an enlarged view showing section A of FIG. 1.

Referring to FIG. 3, an under-fill material may be introduced between the substrate 10 and the capacitor chip 40, thereby forming the under-fill 30. The under-fill material may flow in a direction F depicted in FIG. 3 from one side of the capacitor chip 40. The under-fill material may flow in the first direction D1. For example, the under-fill material may sequentially run through the first region 30a, the third region 30c, and the second region 30b between the substrate 10 and the capacitor chip 40. The present inventive concepts, however, are not limited thereto, and the under-fill material may flow in direction different from the first direction D1. The flow of the under-fill material may be induced by a capillary force. The capillary force may be created due to a difference between a cohesive force of the under-fill materials and an adhesive force between the under-fill materials and the connection terminals 301, and because the adhesive force is greater than the cohesive force, the under-fill material may be introduced into between the substrate 10 and the capacitor chip 40. There may be a variation in capillary force of the under-fill material that passes through the connection terminals 301. The capillary force may be reduced on the third region 30c in which the connection terminals 301 has a low density. For example, in accordance with the density of the connection terminals 301, there may be a variation in flow rate of the under-fill material. When the flow rate of the under-fill material is changed based on the density of the connection terminals 301, a void may be formed within the under-fill 30. The void may be an area which is not filled with the under-fill 30. According to some example embodiments of the present inventive concepts, the dielectric patches 302 may be provided on the third region 30c where the density of the connection terminals 301 is low or the connection terminals 301 are not provided, and thus the under-fill may have a uniform flow rate irrespective of position below the capacitor chip 40. The dielectric patches 302 may structurally serve to replace the connection terminals 301 to thereby increase the capillary force on an area where the density of the connection terminals 301 is low. For example, the dielectric patches 302 may be disposed between the connection terminals 301, thereby controlling the flow rate of the under-fill material. The dielectric patches 302 may adjust the flow rate of the under-fill material to suppress the creation of the void on the third region 30c. Accordingly, the connection terminals 301 may increase quality of the under-fill 30 and may improve structural stability of a semiconductor package.

The dielectric patches 302 may each have a circular shape when viewed in plan. When viewed in plan, the dielectric patches 302 may have the same shape as that of the connection terminals 301. The same interval may be achieved between the connection terminals 301, between the dielectric patches 302, and between the connection terminals 301 and the dielectric patches 302. Therefore, when the under-fill material passes through the dielectric patches 302 and the connection terminals 301, the under-fill material may be exerted with the capillary force, and the flow rate of the under-fill material may be the same or similar irrespective of position. For example, when the under-fill material passes through the dielectric patches 302 and the connection terminals 301 that are disposed at the same interval, the void may be prevented from being formed in the under-fill material. In conclusion, a semiconductor package may increase in durability.

Figure 4:
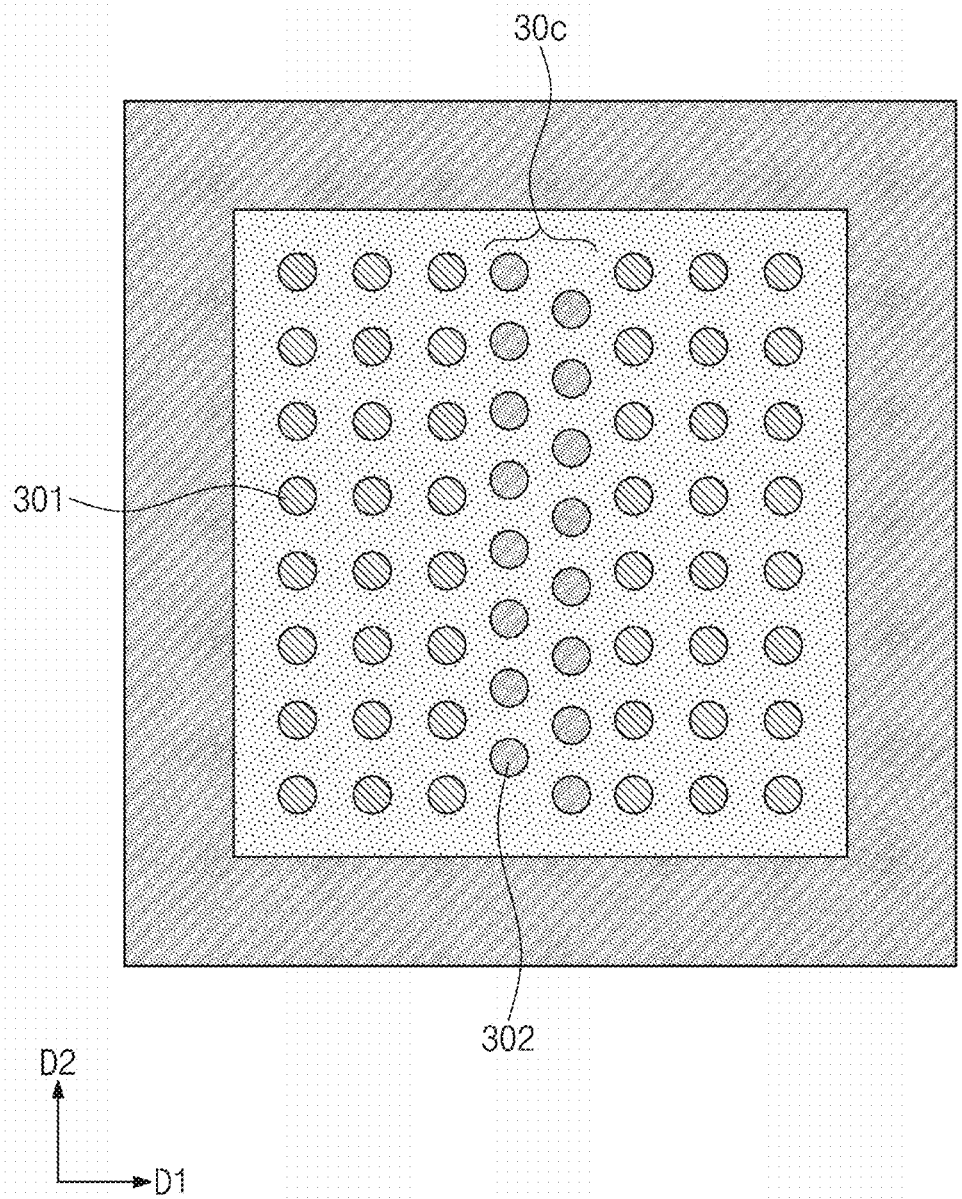

FIG. 4 illustrates an enlarged view showing section A of FIG. 1.

Referring to FIG. 4, the dielectric patches 302 may be arranged to constitute one or more columns in the second direction D2. The columns of the dielectric patches 302 may be spaced apart from each other. An interval between the columns of the dielectric patches 302 may be less than a diameter of each of the connection terminals 301. According to that shown in FIG. 4, two columns may be disposed on the third region 30c, and the interval between the columns of the dielectric patches 302 may be the same as the interval between arrangements in the second direction D2 of the connection terminals 301 adjacent to the dielectric patches 302. The present inventive concepts, however, are not limited thereto, and the arrangement of the dielectric patches 302 may be changed based on a width in the first direction D1 of the third region 30c. The interval between the columns of the dielectric patches 302 may be the same as, relatively greater, or relatively less than the interval between the arrangements in the second direction D2 of the connection terminals 301 adjacent to the dielectric patches 302.

Figure 5:
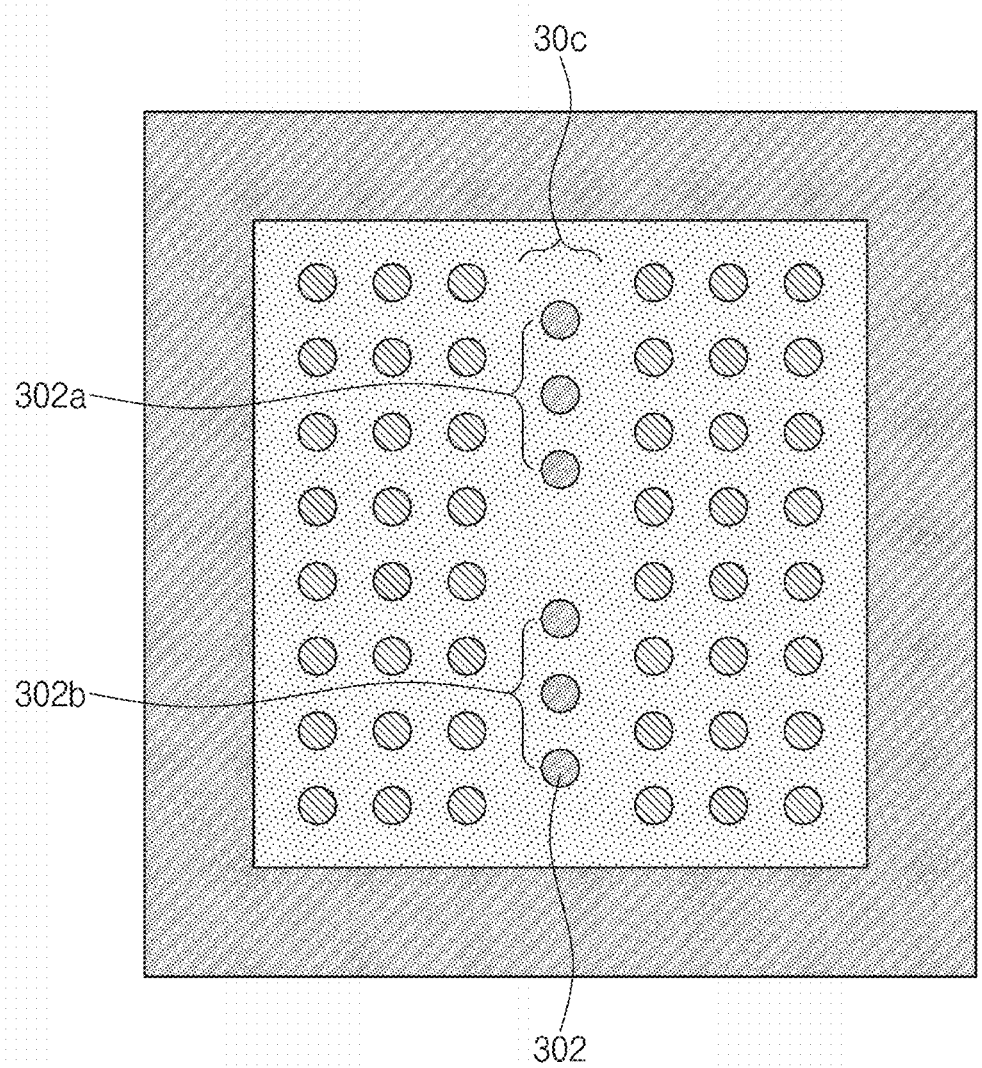

FIG. 5 illustrates an enlarged view showing section A of FIG. 1.

Referring to FIG. 5, there may be a variation in interval between the dielectric patches 302. A relatively large or small interval may be provided between the dielectric patches 302. For example, according to that shown in FIG. 5, the third region may include an area where the dielectric patches 302 are not provided, and the dielectric patches 302 may include first dielectric patches 302a and second dielectric patches 302b spaced apart from the first dielectric patches 302a. An interval between the first dielectric patches 302a and the second dielectric patches 302b may be greater than a distance between the first dielectric patches 302a and a distance between the second dielectric patches 302b. For example, a distance between one of the first dielectric patches 302a and its adjacent one of the second dielectric patches 302b may be greater than the distance between the first dielectric patches 302a and the distance between the second dielectric patches 302b. According to that shown in FIG. 5, the dielectric patches 302 may include the first dielectric patches 302a and the second dielectric patches 302b, but the present inventive concepts are not limited thereto. The dielectric patches 302 may constitute two, three, or more dielectric pattern groups spaced apart from each other, if desired. The variation in interval between the dielectric patches 302 may induce a difference in flow rate of the under-fill material. The capillary force may cause a reduction in the flow rate of the under-fill material on an area where there is a wide interval between the dielectric patches 302. The capillary force may cause an increase in the flow rate of the under-fill material on an area where there is a narrow interval between the dielectric patches 302. The distance between the dielectric patches 302 may be adjusted to induce a reduction in the flow rate on an area where the flow of the under-fill material is concentrated.

Figure 6:
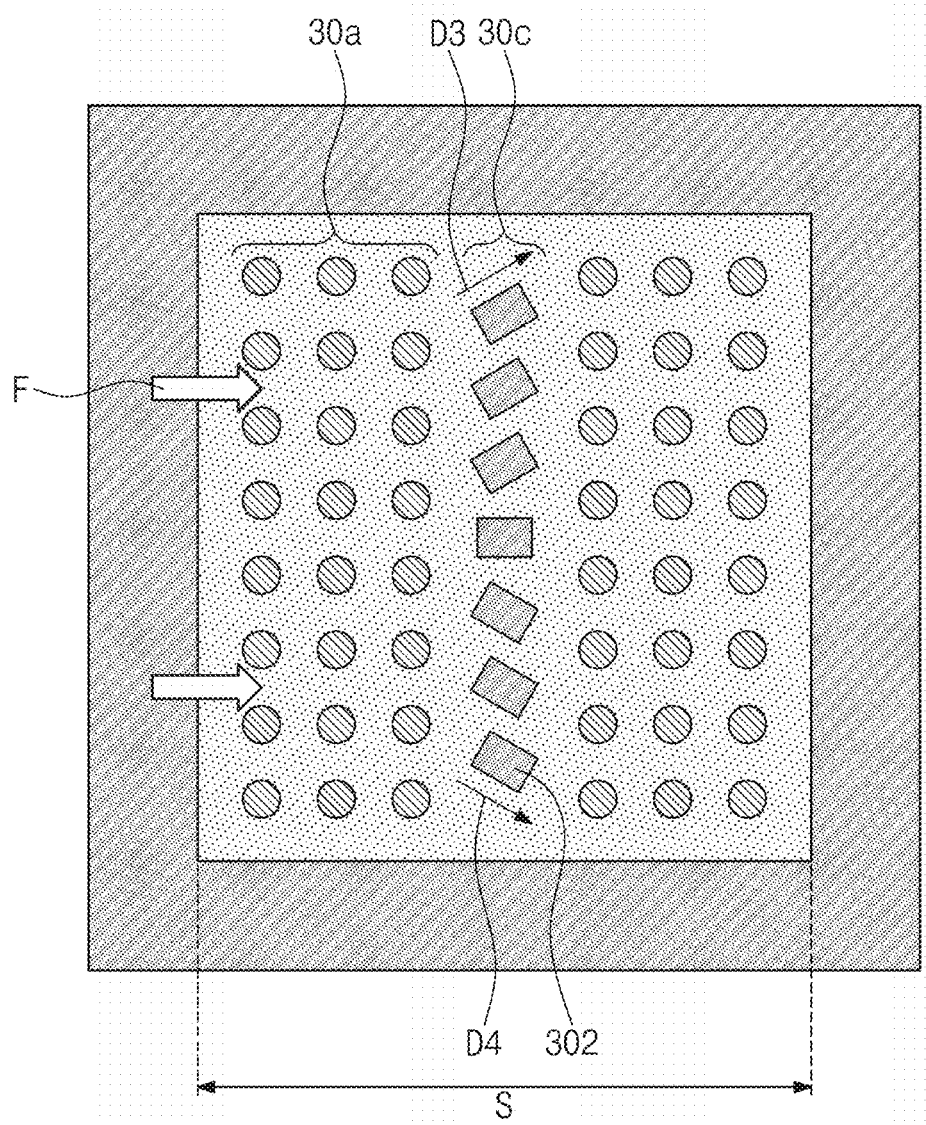

FIG. 6 illustrates an enlarged view showing section A of FIG. 1.

Referring to FIG. 6, the dielectric patches 302 may each have a tetragonal shape when viewed in plan. The present inventive concepts, however, are not limited thereto, and the dielectric patches 302 may have a shape including a straight line when viewed in plan. When viewed in plan, the dielectric patches 302 having tetragonal shapes may be inclined in a specific direction. When viewed in plan, the dielectric patches 302 having tetragonal shapes may be inclined in at least one direction. When viewed in plan, the dielectric patches 302 having tetragonal shapes may be inclined in a direction that makes an acute angle with the direction F along which the under-fill material flows on the first region 30a. Therefore, a flow direction of the under-fill material on the third region 30c may be changed differently from the flow direction of the under-fill material on the first region 30a. For example, the dielectric patches 302 may each be inclined in a third direction D3 or a fourth direction D4. Therefore, the under-fill material may flow along the third direction D3 and the fourth direction D4. The third direction D3 and the fourth direction D4 may be directed toward different corners of the mount region S. According to that shown in FIG. 6, although the dielectric patches 302 are each inclined in the third direction D3 or the fourth direction D4, the present inventive concepts are not limited thereto, and the dielectric patches 302 may be inclined in a direction along which the flow of the under-fill material is intended to be concentrated. It may thus be possible to adjust the flow of the under-fill material.

Figure 7:
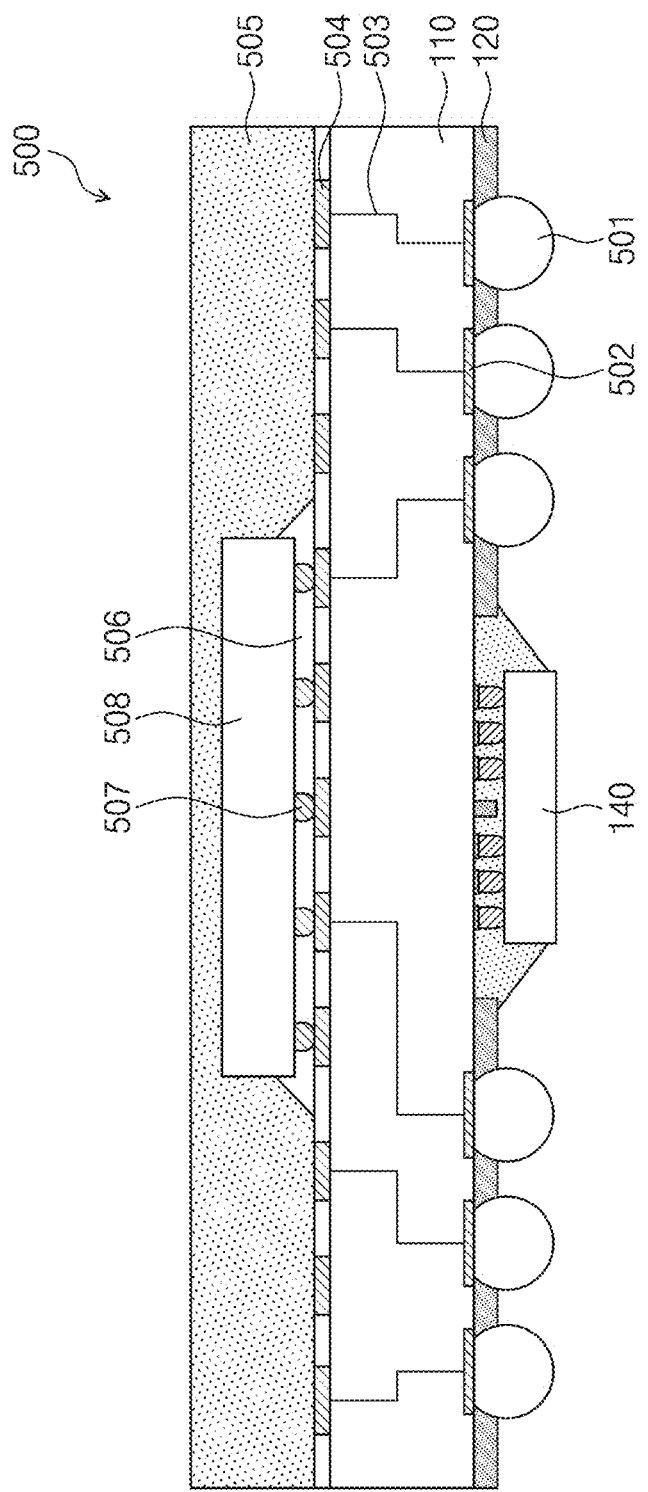
FIG. 7 illustrates a cross-sectional view showing a semiconductor package according to an example embodiment of the present inventive concepts.

FIG. 7 illustrates a cross-sectional view showing a semiconductor package according to an example embodiment of the present inventive concepts.

In the semiconductor package according to the example embodiment of FIG. 7, omission will be made to avoid repetitive descriptions of components included in the semiconductor packages according to the example embodiments of FIGS. 2 to 6, and the following will focus on differences between the present example embodiment and the previous example embodiments.

Referring to FIG. 7, a first package 500 may include a first substrate 110 and a capacitor chip 140. A configuration of the first substrate 110 and the capacitor chip 140 may be the same as or substantially similar to that of the substrate 10 and the capacitor chip 40 discussed with reference to FIGS. 1 to 6.

The first substrate 110 may further include lower substrate pads 502 on a bottom surface thereof. The lower substrate pads 502 may be covered with a dielectric layer 120. The lower substrate pads 502 may be provided thereon with external connection terminals 501. The external connection terminals 501 may penetrate the dielectric layer 120 to come into connection with the lower substrate pads 502. The first substrate 110 may further include connection pads 504 on a top surface thereof. The connection pads 504 may be provided for mounting a first semiconductor chip 508. The connection pads 504 and the lower substrate pads 502 may be electrically connected to each other through internal connection lines 503 provided in the first substrate 110.

The first semiconductor chip 508 may be mounted on the first substrate 110. The first semiconductor chip 508 may be a memory chip, a logic chip, or an application processor (AP) chip, but the present inventive concepts are not limited thereto. The first semiconductor chip 508 may be connected through first chip connection terminals 507 to the connection pads 504.

A second under-fill 506 may be provided between the first substrate 110 and the first semiconductor chip 508. The second under-fill 506 may surround the first chip connection terminals 507 between the first substrate 110 and the first semiconductor chip 508.

A first molding layer 505 may be provided on the first substrate 110. The first molding layer 505 may cover the first semiconductor chip 508 on the top surface of the first substrate 110. The first molding layer 505 may not expose the first semiconductor chip 508.

Figure 8:
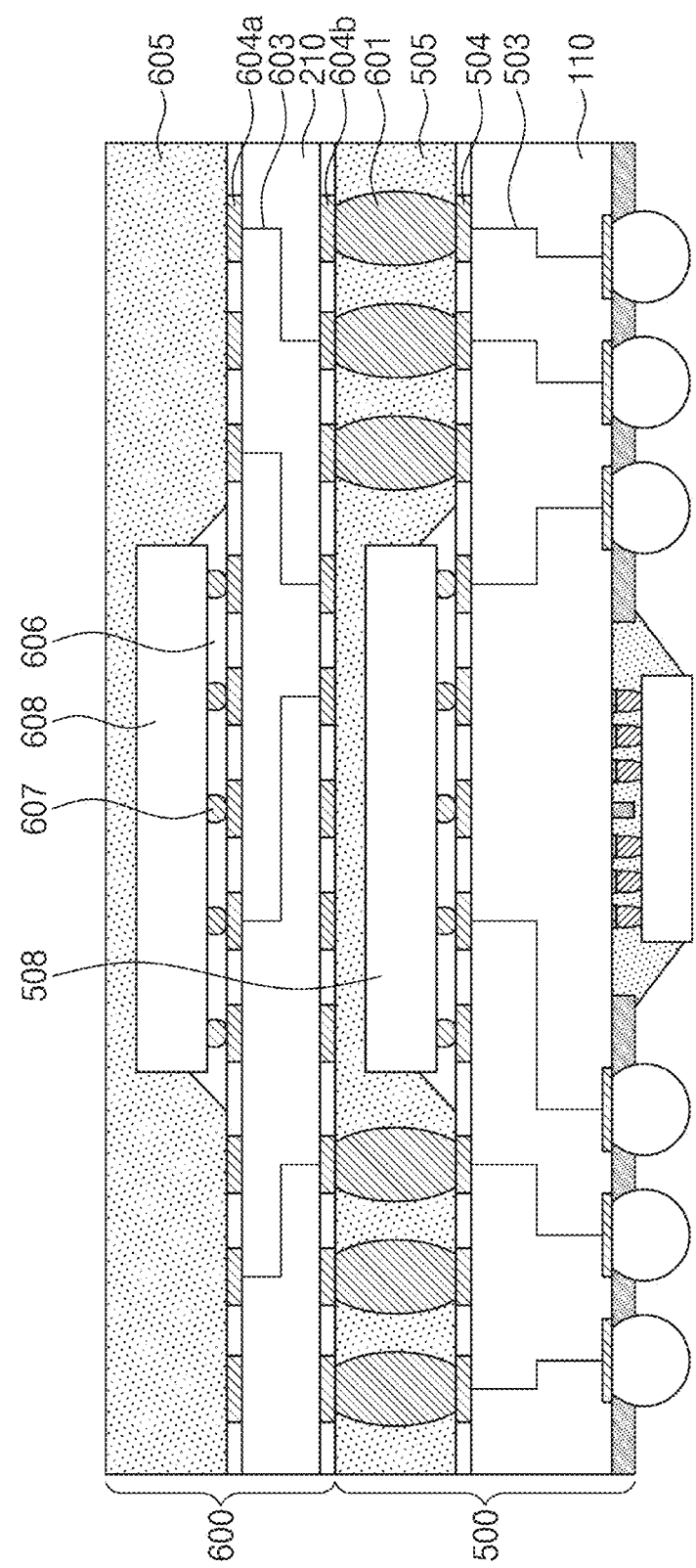
FIG. 8 illustrates a cross-sectional view showing a semiconductor package according to an example embodiment of the present inventive concepts.

FIG. 8 illustrates a cross-sectional view showing a semiconductor package according to an example embodiment of the present inventive concepts.

In the semiconductor package according to the example embodiment of FIG. 8, omission will be made to avoid repetitive descriptions of components included in the first package 500 according to the embodiment of FIG. 7, and the following will focus on differences between the present example embodiment and the previous example embodiments.

Referring to FIG. 8, a second package 600 may be provided on the first package 500. The second package 600 may include a second substrate 210. The second substrate 210 may be disposed on the first molding layer 505. The second substrate 210 may include a printed circuit board (PCB). The second substrate 210 may have a top surface and a bottom surface that are opposite to each other. The second substrate 210 may include upper connection pads 604a on the top surface thereof and lower connection pads 604b on the bottom surface thereof. The lower connection pads 604b may connect the first package 500 and the second package 600 to each other. The upper connection pads 604a may connect the second substrate 210 to a second semiconductor chip 608 mounted on the second substrate 210. The second substrate 210 may include second internal connection lines 603. The upper connection pads 604a and the lower connection pads 604b may be electrically connected to each other through the second internal connection lines 603 provided in the second substrate 210.

The second semiconductor chip 608 may be mounted on the second substrate 210. The second semiconductor chip 608 may be connected through second chip connection terminals 607 to the upper connection pads 604a. A third under-fill 606 may be provided between the second substrate 210 and the second semiconductor chip 608. The third under-fill 606 may surround the second chip connection terminals 607. A second molding layer 605 may be provided on the second substrate 210. The second molding layer 605 may cover the second semiconductor chip 608 on the top surface of the second substrate 210. The second molding layer 605 may not expose the second semiconductor chip 608.

The first substrate 110 may be provided with conductive structures 601 thereon. When viewed in plan, the conductive structures 601 may be disposed on an edge of the first substrate 110. The conductive structures 601 may be provided on one side of the first semiconductor chip 508. The conductive structures 601 may have their top surfaces connected to the lower connection pads 604a and their bottom surfaces connected to the connection pads 504. The conductive structures 601 may penetrate the first molding layer 505 to connect the first substrate 110 and the second substrate 210 to each other.

Figure 9:
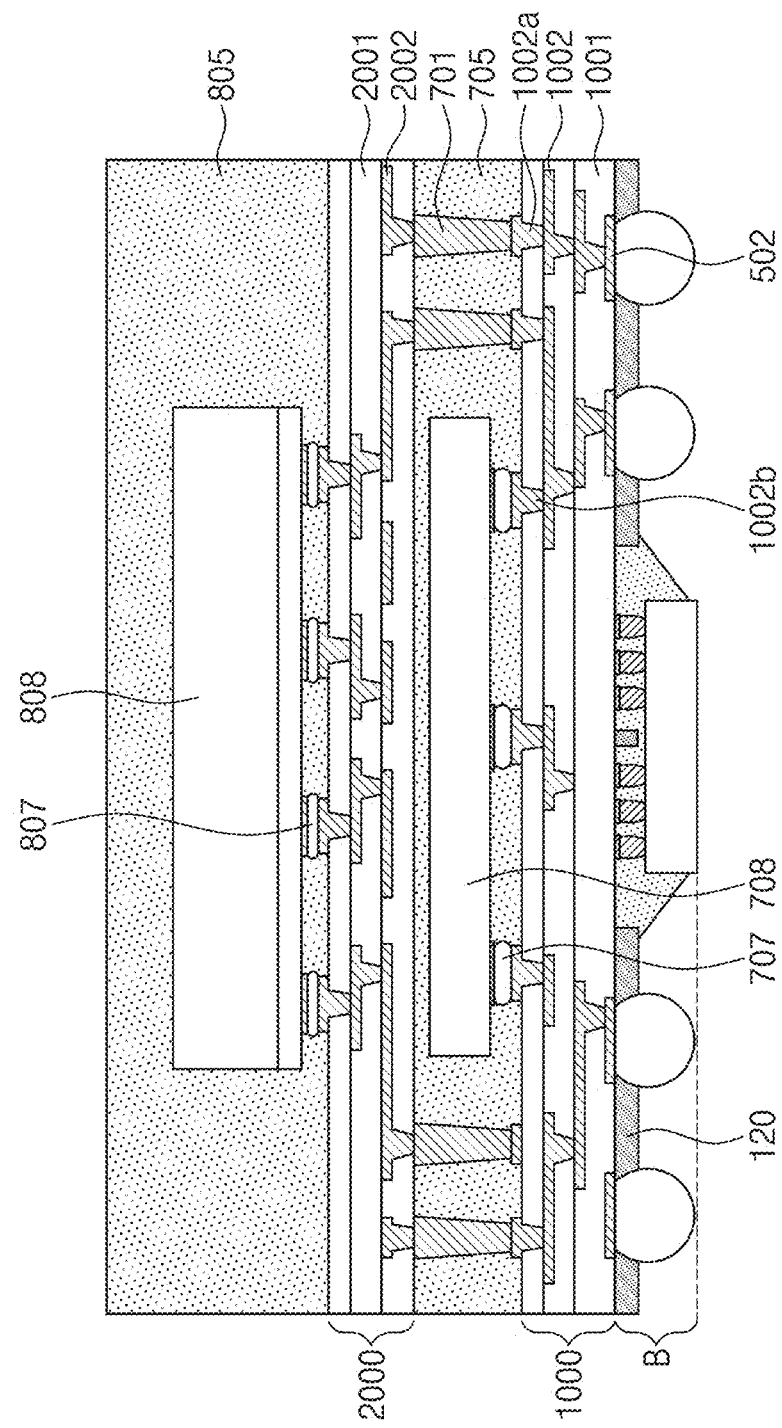
FIG. 9 illustrates a cross-sectional view showing a semiconductor package according to an example embodiment of the present inventive concepts.

FIG. 9 illustrates a cross-sectional view showing a semiconductor package according to an example embodiment of the present inventive concepts.

In the semiconductor package according to the example embodiment of FIG. 9, omission will be made to avoid a repetitive description of section B of the semiconductor package, and the following will focus on differences between the present example embodiment and the previous example embodiments.

Referring to FIG. 9, a first package substrate 1000 may be provided on the dielectric layer 120. The first package substrate 1000 may include stacked wiring layers. The first package substrate 1000 may include a first dielectric layer 1001 and first wiring patterns 1002. The first wiring patterns 1002 may be electrically connected to other first wiring patterns 1002 adjacent thereto. The first wiring patterns 1002 may be connected to the lower substrate pads 502. The first wiring patterns 1002 may protrude onto a top surface of the first package substrate 1000. The protruding first wiring patterns 1002 may correspond to first substrate pads 1002a and second substrate pads 1002b. The first substrate pads 1002a may be connected to first conductive structures 701, and the second substrate pads 1002b may be connected to a first semiconductor chip 708.

The first semiconductor chip 708 may be mounted on the first package substrate 1000. The first semiconductor chip 708 may be provided with first connection terminals 707 on a bottom surface thereof. The first connection terminals 707 may electrically connect the first semiconductor chip 708 to the second substrate pads 1002b. Therefore, the first semiconductor chip 708 may be electrically connected through the first connection terminals 707 to the first package substrate 1000.

A first molding layer 705 may be provided on the first package substrate 1000. The first molding layer 705 may cover the top surface of the first package substrate 1000 and may surround the first semiconductor chip 708. The first molding layer 705 may fill a space between the first package substrate 1000 and the first semiconductor chip 708. The first molding layer 705 may surround the first connection terminals 707 between the first package substrate 1000 and the first semiconductor chip 708.

The first conductive structure 701 may be provided on the first package substrate 1000. The first conductive structure 701 may be disposed on one side of the first semiconductor chip 708. The first conductive structure 701 may vertically penetrate the first molding layer 705. One end of the first conductive structure 701 may be directed toward the first package substrate 1000 to come into connection with the second substrate pad 1002b of the first package substrate 1000. Another end of the first conductive structure 701 may be exposed on a top surface of the first molding layer 705. The first conductive structure 701 may constitute a wiring line for connecting the second semiconductor chip 808 to the first package substrate 1000, and may electrically connect the first package substrate 1000 to a second package substrate 2000 on which a second semiconductor chip 808 is mounted.

A second package substrate 2000 may be provided on the first molding layer 705. A bottom surface of the second package substrate 2000 may be in contact with the top surface of the first molding layer 705 and a top surface of the first conductive structure 701. The second package substrate 2000 may include stacked wiring layers. The second package substrate 2000 may include a second dielectric layer 2001 and second wiring patterns 2002. The second wiring patterns 2002 may be electrically connected to other second wiring patterns 2002 adjacent thereto. The second wiring patterns 2002 may protrude onto the second package substrate 2000. The protruding second wiring patterns 2002 may be connected to the second semiconductor chip 808. The second wiring patterns 2002 may electrically connect the second semiconductor chip 808 to the first conductive structures 701. Therefore, the second semiconductor chip 808 may be electrically connected through the first conductive structures 701 to the first package substrate 1000 and the first semiconductor chip 708.

The second semiconductor chip 808 may be mounted on the second package substrate 2000. When viewed in plan, the second semiconductor chip 808 may cover the first semiconductor chip 708. The second semiconductor chip 808 may be provided with second connection terminals 807 on a bottom surface thereof. The second connection terminals 807 may electrically connect the second semiconductor chip 808 to the second wiring patterns 2002 that protrude onto the second package substrate 2000. Therefore, the second semiconductor chip 808 may be electrically connected through the second connection terminals 807 to the second package substrate 2000. The second semiconductor chip 808 may be electrically connected to the first package substrate 1000 and the first semiconductor chip 708 through the second connection terminals 807, the second package substrate 2000, and the first conductive structures 701.

A second molding layer 805 may be provided on the second package substrate 2000. The second molding layer 805 may cover a top surface of the second package substrate 2000 and may surround the second semiconductor chip 808. The second molding layer 805 may fill a space between the second package substrate 2000 and the second semiconductor chip 808. The second molding layer 805 may surround the second connection terminals 807 between the second package substrate 2000 and the second semiconductor chip 808.

Figure 10:
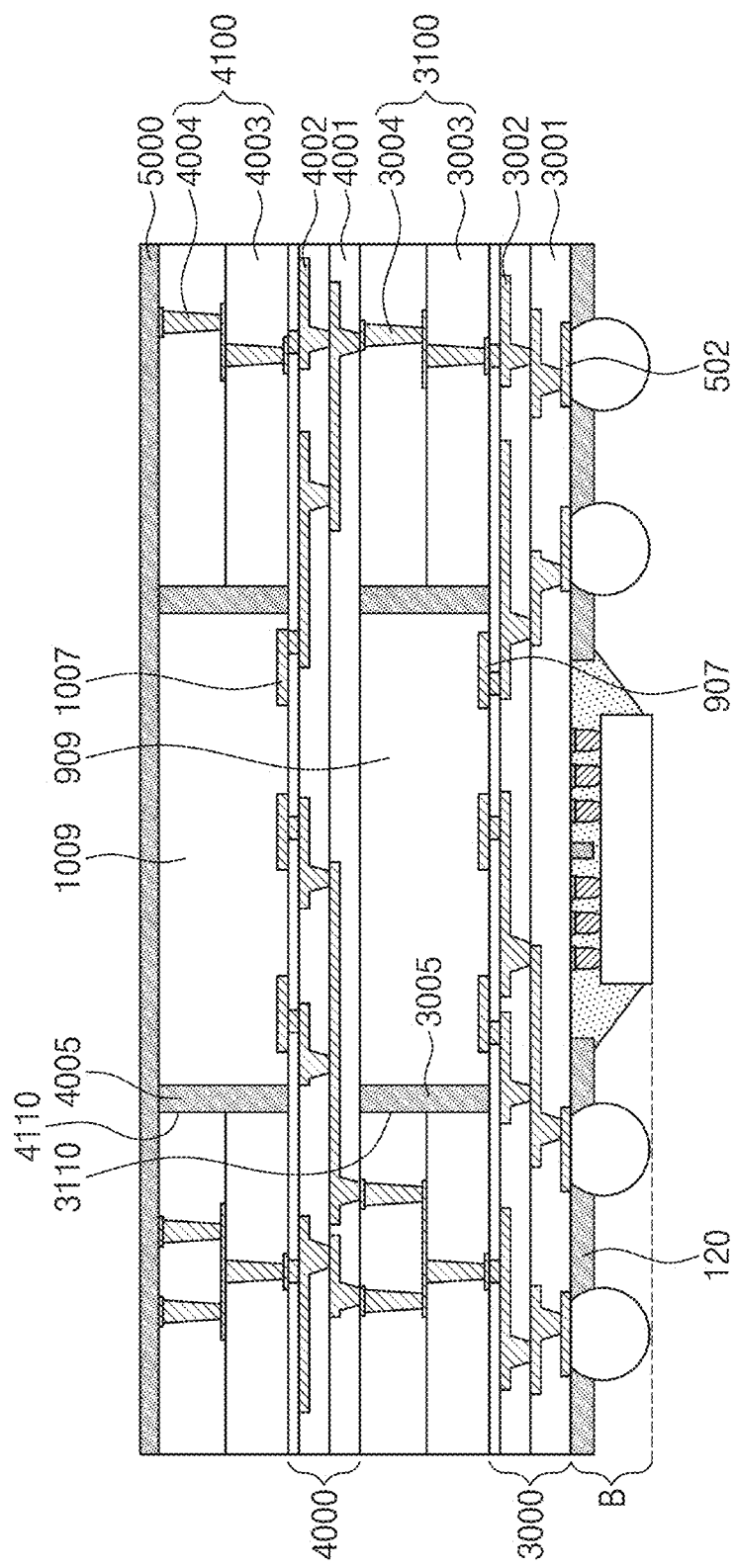
FIG. 10 illustrates a cross-sectional view showing a semiconductor package according to an example embodiment of the present inventive concepts.

FIG. 10 illustrates a cross-sectional view showing a semiconductor package according to an example embodiment of the present inventive concepts.

In the semiconductor package according to the example embodiment of FIG. 10, omission will be made to avoid a repetitive description of section B of the semiconductor package according to the example embodiment of FIG. 7, and the following will focus on differences between the present example embodiment and the previous example embodiments.

Referring to FIG. 10, a first package substrate 3000 may be provided on a dielectric layer 120. The first package substrate 3000 may include stacked wiring layers. The first package substrate 3000 may include a first dielectric layer 3001 and first wiring patterns 3002. The first wiring patterns 3002 may be electrically connected to other first wiring patterns 3002 adjacent thereto. The first wiring patterns 3002 may be connected to the lower substrate pads 502.

A first connection substrate 3100 may be disposed on the first package substrate 3000. The first connection substrate 3100 may have a first opening 3110 penetrating therethrough. The first opening 3110 may have an open hole shape that connects top and bottom surfaces of the first connection substrate 3100. The bottom surface of the first connection substrate 3100 may be in contact with a top surface of the first package substrate 3000. The first connection substrate 3100 may include a first dielectric pattern 3003 and first conductive patterns 3004. The first conductive patterns 3004 may be spaced apart from the first opening 3110. The first conductive patterns 3004 may be disposed outside the first opening 3110. The first conductive patterns 3004 may vertically penetrate the first dielectric pattern 3003 to come into electrical connection with the first wiring patterns 3002.

A first semiconductor chip 909 may be disposed on the first package substrate 3000. The first semiconductor chip 909 may be disposed in the first opening 3110 of the first connection substrate 3100. A bottom surface of the first semiconductor chip 909 may be located at the same level as the bottom surface of the first connection substrate 3100. The first semiconductor chip 909 may be provided with first chip pads 907 on the bottom surface thereof. The first chip pads 907 may be electrically connected to the first wiring patterns 3002 of the first package substrate 3000.

A first dielectric layer 3005 may be disposed on the first package substrate 3000. The first dielectric layer 3005 may be provided between the first connection substrate 3100 and the first semiconductor chip 909. A bottom surface of the first dielectric layer 3005 may be in contact with the top surface of the first package substrate 3000.

A second package substrate 4000 may be provided on the first connection substrate 3100. The second package substrate 4000 may include stacked wiring layers. The second package substrate 4000 may include a second dielectric layer 4001 and second wiring patterns 4002. The second wiring patterns 4002 may be electrically connected to other second wiring patterns 4002 adjacent thereto. The second wiring patterns 4002 may be connected to the first conductive patterns 3004 of the first connection substrate 3100. Therefore, the second package substrate 4000 may be electrically connected to the first package substrate 3000 and the first semiconductor chip 909 through the first connection substrate 3100 connected to the second wiring patterns 4002.

A second connection substrate 4100 may be disposed on the second package substrate 4000. The second connection substrate 4100 may have a second opening 4110 penetrating therethrough. According to that shown in FIG. 10, the second opening 4110 is illustrated to vertically overlap the first opening 3110, but the present inventive concepts are not limited thereto. The second opening 4110 may have an open hole shape that connects top and bottom surfaces of the second connection substrate 4100. The bottom surface of the second connection substrate 4100 may be in contact with a top surface of the second package substrate 4000. The second connection substrate 4100 may include a second dielectric pattern 4003 and second conductive patterns 4004. The second conductive patterns 4004 may be spaced apart from the second opening 4110. The second conductive patterns 4004 may be disposed outside the second opening 4110. The second conductive patterns 4004 may vertically penetrate the second dielectric pattern 4003 to come into electrical connection with the second wiring patterns 4002.

A second semiconductor chip 1009 may be disposed on the second package substrate 4000. The second semiconductor chip 1009 may be disposed in the second opening 4110 of the second connection substrate 4100. A bottom surface of the second semiconductor chip 1009 may be located at the same level as the bottom surface of the second connection substrate 4100. The second semiconductor chip 1009 may be provided with second chip pads 1007 on the bottom surface thereof. The second chip pads 1007 may be electrically connected to the second wiring patterns 4002 of the second package substrate 4000.

A second dielectric layer 4005 may be disposed on the second package substrate 4000. The second dielectric layer 4005 may be provided between the second connection substrate 4100 and the second semiconductor chip 1009. A bottom surface of the second dielectric layer 4005 may be in contact with the top surface of the second package substrate 4000.

The second package substrate 4000 may be provided with a molding layer 5000 that covers the second semiconductor chip 1009 and the second connection substrate 4100. The molding layer 5000 may be in contact with a top surface of the second semiconductor chip 1009 and the top surface of the second connection substrate 4100.

A semiconductor package according to some example embodiments of the present inventive concepts may include a dielectric patch provided on an area at which the density of connection terminals, which connect a capacitor and a substrate to each other, is reduced due to an increase in size of the capacitor. When the density of connection terminals is reduced, imbalance of under-fill flow in the relevant area may occur caused by a reduction in capillary force, and there may be high possibility of void formation. Therefore, the area where the density of connection terminals is reduced may be provided thereon with the dielectric patch that structurally replaces the connection terminal, such that imbalance of under-fill flow may be improved and the void formation may be restricted, with the result that an under-fill region may improve in filling ability. Thus, a semiconductor package may improve in structural stability.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:
1. A semiconductor package, comprising:
a substrate;
a dielectric layer on the substrate, the dielectric layer having an opening that exposes a portion of a top surface of the substrate;
a capacitor chip mounted on the substrate, the capacitor chip being within the opening of the dielectric layer in plan view;
connection terminals between the substrate and the capacitor chip, the connection terminals being on a bottom surface of the capacitor chip and connected to chip pads of the capacitor chip, the connection terminals connecting the substrate and the capacitor chip to each other;
dielectric patches on the substrate and in the opening of the dielectric layer; and
an under-fill filling a space between the substrate and the capacitor chip,
wherein the space between the substrate and the capacitor chip includes a first region, a second region, and a third region between the first region and the second region, the first and second regions being horizontally spaced apart from each other, a density of the connection terminals in the third regions is lower than a density of the connection terminals in each of the first region and the second region,
wherein the connection terminals are on the first region and the second region,
wherein the dielectric patches are on the third region and are completely and laterally surrounded by the under-fill, and wherein a top surface of the dielectric layer is at a same level as top surfaces of the dielectric patches.

2. The semiconductor package of claim 1, wherein the capacitor chip includes a silicon capacitor.

3. The semiconductor package of claim 1, wherein a width in a direction of the third region is greater than a diameter of each of the connection terminals, the direction being directed from the first region toward the second region.

4. The semiconductor package of claim 1, wherein each of the dielectric patches has a circular planar shape, a tetragonal planar shape, or a polygonal planar shape.

5. The semiconductor package of claim 1, wherein the dielectric patches constitute at least one column extending in a first direction that is horizontally perpendicular to a second direction from the first region toward the second region.

6. The semiconductor package of claim 1, wherein the dielectric patches include:
first dielectric patches; and
second dielectric patches spaced apart from the first dielectric patches,
wherein an interval between one of the first dielectric patches and an adjacent one of the second dielectric patches is greater than a distance between the first dielectric patches and a distance between the second dielectric patches.

7. The semiconductor package of claim 1, wherein, when viewed in plan, an area of each of the dielectric patches is 0.8 times to 1.2 times an area of each of the connection terminals.

8. The semiconductor package of claim 1, wherein the dielectric patches includes a same material as the dielectric layer.

9. A semiconductor package, comprising:
a first substrate;
a dielectric layer below the first substrate, the dielectric layer exposing a portion of the first substrate;
a capacitor chip mounted on the portion of the first substrate, the portion of the first substrate being exposed by the dielectric layer, the capacitor chip being within the portion of the first substrate in plan view;
an under-fill filling a space between the first substrate and the capacitor chip;
connection terminals between the first substrate and the capacitor chip and electrically connecting the first substrate to the capacitor chip, the connection terminals being on a bottom surface of the capacitor chip and connected to chip pads of the capacitor chip, the connection terminals including first connection terminals in a first region and second connection terminals in a second region spaced apart from the first connection terminals by a third region;
dielectric patches below the first substrate and between the first connection terminals and the second connection terminals, the dielectric patches including a same material as the dielectric layer, the dielectric patches being completely and laterally surrounded by the under-fill, each of a density of the first connection terminals in the first region and a density of the second connection terminals in the second region is greater than a density of the connection terminals in the third region;
a first semiconductor chip mounted on the first substrate; and
a first molding layer on the first substrate, the first molding layer covering the first semiconductor chip.

10. The semiconductor package of claim 9, further comprising:
a second substrate on the first molding layer;
a second semiconductor chip mounted on the second substrate;
a second molding layer on the second substrate and covering the second semiconductor chip; and
substrate connection terminals penetrating the first molding layer on one side of the first semiconductor chip, the substrate connection terminals connecting the first substrate to the second substrate.

11. The semiconductor package of claim 9, wherein the capacitor chip includes a silicon capacitor.

12. The semiconductor package of claim 9, wherein an interval between one of the first connection terminals and an adjacent one of the second connection terminals is greater than a diameter of each of the connection terminals.

13. The semiconductor package of claim 9, wherein each of the dielectric patches has a circular planar shape, a tetragonal planar shape, or a polygonal planar shape.

14. The semiconductor package of claim 9, wherein the dielectric patches constitute at least one column in a region between the first connection terminals and the second connection terminals and extending in a first direction that is horizontally perpendicular to a second direction from the first connection terminals toward the second connection terminals.

15. The semiconductor package of claim 9, wherein the dielectric patches include:
first dielectric patches; and
second dielectric patches spaced apart from the first dielectric patches,
wherein an interval between one of the first dielectric patches and an adjacent one of the second dielectric patches is greater than a distance between the first dielectric patches and a distance between the second dielectric patches.

16. The semiconductor package of claim 9, wherein, when viewed in plan, an area of each of the dielectric patches is 0.8 times to 1.2 times an area of each of the connection terminals.

17. The semiconductor package of claim 9, wherein a bottom surface of the dielectric layer is at a same level as bottom surfaces of the dielectric patches.

18. A semiconductor package, comprising:
a substrate;
a dielectric layer exposing a mount region of the substrate;
a capacitor chip mounted on the mount region of the substrate, the capacitor chip being withing the mount region of the substrate in plan view;
connection terminals between the substrate and the capacitor chip and connecting the substrate and the capacitor chip, the connection terminals being on a bottom surface of the capacitor chip and connected to chip pads of the capacitor chip;
dielectric patches on the mount region of the substrate; and
an under-fill filling a space between the substrate and the capacitor chip,
wherein the mount region includes a first region, a second region, and a third region between the first region and the second region, the first and second regions being provided with the connection terminals, and the third region being provided with the dielectric patches, the dielectric patches completely and laterally surrounded by the under-fill, a density of the connection terminals in the third region is lower than a density of the connection terminals in each of the first region and the second region, and wherein a first distance between an adjacent pair of the connection terminals, a second distance between an adjacent pair of the dielectric patches, and a third distance between each of the connection terminals and a corresponding one of the dielectric patches are a same distance.

19. The semiconductor package of claim 18, wherein the capacitor chip includes a silicon capacitor.

20. The semiconductor package of claim 18, wherein a width in a direction of the third region is greater than a diameter of each of the connection terminals, the direction being directed from the first region toward the second region.

* * * * *